(12) United States Patent
Suzuki

(10) Patent No.: US 10,036,797 B2
(45) Date of Patent: Jul. 31, 2018

(54) ELECTRON SPIN RESONANCE APPARATUS

(71) Applicant: JEOL Ltd., Tokyo (JP)

(72) Inventor: Takayuki Suzuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 408 days.

(21) Appl. No.: 14/874,757

(22) Filed: Oct. 5, 2015

(65) Prior Publication Data

US 2016/0097832 A1 Apr. 7, 2016

(30) Foreign Application Priority Data

Oct. 6, 2014 (JP) .................................. 2014-205964
Aug. 25, 2015 (JP) .................................. 2015-165654

(51) Int. Cl.
*G01R 33/60* (2006.01)
*G01R 33/32* (2006.01)
*G01R 33/36* (2006.01)

(52) U.S. Cl.
CPC ............ *G01R 33/60* (2013.01); *G01R 33/323* (2013.01); *G01R 33/3621* (2013.01)

(58) Field of Classification Search
CPC ... G01R 33/60; G01R 33/323; G01R 33/3621
See application file for complete search history.

(56) References Cited

U.S. PATENT DOCUMENTS

| 2011/0101977 A1* | 5/2011 | Nakanishi | G01R 33/3692 324/307 |
| 2011/0109316 A1* | 5/2011 | Akita | G01R 33/3607 324/322 |
| 2017/0328965 A1* | 11/2017 | Hruby | G01R 33/26 |

OTHER PUBLICATIONS

A. Schweiger et al., entitled "Pulsed ESR with Longitudinal Detection. A Novel Recording Technique", Journal of Magnetic Resonane, (1988), pp. 512-523, 77.
D. Lepine, entitled "Spin-Dependent Recombination on Silicon Surface", Physical Review B, (1972), pp. 436-441, vol. 6, No. 2.

* cited by examiner

*Primary Examiner* — Rodney Bonnette
(74) *Attorney, Agent, or Firm* — The Webb Law Firm

(57) ABSTRACT

A pulse pattern forming a pulse sequence is repeatedly generated according to a repetition frequency Fp, and an original pulse train is generated. A modulation signal which repeats ON and OFF states at a modulation frequency Fm is generated. Fp and Fm are in a relationship $Fp=2n \times Fm$, wherein n is an integer greater than or equal to 1. The original pulse train is modulated according to the modulation frequency Fm, and a pulse train signal is generated. A microwave signal is modulated by the pulse train signal and is supplied to an electron spin resonance chamber. By executing a lock-in demodulation on a detection signal reflecting electron spin resonance using the modulation frequency Fm, an ESR signal is obtained.

7 Claims, 8 Drawing Sheets

ELECTRON SPIN RESONANCE APPARATUS

PRIORITY INFORMATION

This application claims priority to Japanese Patent Application Nos. 2014-205964 filed on Oct. 6, 2014, and 2015-165654 filed on Aug. 25, 2015 which are incorporated herein by reference in their entirety.

BACKGROUND

Technical Field

The present invention relates to an electron spin resonance apparatus (ESR apparatus), and in particular to a technique for detecting an ESR signal by lock-in demodulation.

Related Art

An electron spin resonance apparatus (ESR apparatus) is a type of a magnetic resonance apparatus, which irradiates a microwave onto a sample placed in a static magnetic field, and which records absorption of the microwave by the sample in the form of a spectrum.

FIG. 7 shows an example of an ESR apparatus. The ESR apparatus is an apparatus which can execute continuous wave (CW) ESR and pulse ESR. Some ESR apparatuses are capable of executing only the continuous wave ESR.

First, the continuous wave ESR will be explained. A sample tube with a sample 100 disposed inside is inserted into a microwave resonator 102. The microwave resonator 102 is placed between two electromagnets 104. With such a configuration, the microwave resonator 102 is placed in a static magnetic field generated by the electromagnets 104. In the continuous wave ESR measurement, a magnetic field modulation coil 106 is used. For example, a magnetic field modulation coil 106 is placed outside of the microwave resonator 102.

When the continuous wave ESR is executed, a path 116 is formed by switches 112 and 114. A microwave generated by a microwave oscillator 108 is attenuated by an attenuator 110 to a predetermined electric power, and is then supplied to the microwave resonator 102 through the path 116 and a circulator 118. After a degree of coupling between the microwave line path and the microwave resonator 102 is adjusted to a state where there is almost no reflection wave from the microwave resonator 102, the static magnetic field is swept by the electromagnets 104. When the ESR phenomenon is caused by the sweeping of the static magnetic field, absorption of the microwave by the sample 100 in the microwave resonator 102 is caused, a Q value of the microwave resonator 102 is changed to thereby cause reflection of the microwave, and a reflected microwave is extracted through the circulator 118. When the continuous wave ESR is executed, a path 122a is formed by a switch 120. The reflected microwave is supplied through the path 122a to a phase demodulator 126. Phase demodulation is executed by the phase demodulator 126 with respect to the reflected microwave and a reference signal which is sent through a phase shifter 124. With such a configuration, an absorption signal by the ESR phenomenon is detected. For example, an AC current of about 100 kHz generated at an oscillator 128 is supplied to the magnetic field modulation coil 106 so that a modulation magnetic field is superposed on the static magnetic field formed by the electromagnets 104, and an absorption signal modulated by 100 kHz is observed. The absorption signal is amplified by an amplifier, and phase demodulation is executed by a phase demodulator 130 (for example, a Phase Sensitive Detector (PSD)) using a reference signal supplied from the oscillator 128 (lock-in demodulation). A signal which is output from the phase demodulator 130 passes through a low-pass filter 131, and a continuous wave ESR spectrum signal 132 is obtained as a DC component.

Next, the pulse ESR will be explained. In the pulse ESR, the magnetic field modulation is not executed. A microwave generated by the microwave oscillator 108 is supplied through the switch 112 to a phase adjuster 134. The phase adjuster 134 is formed from, for example, a four-phase switch. The phase adjuster 134 has a function to output, for example, microwaves shifted in phase by 90° such as those at 0°, 90°, 180°, and 270°. With such a configuration, an arbitrary phase can be selected from the four phases. A microwave which is output from the phase adjuster 134 is supplied to a switch 136. With a switching operation (switching between ON and OFF states) by the switch 136, a microwave pulse is formed. The microwave pulse is amplified by an amplifier 138, and is supplied through the switch 114 and the circulator 118 to the microwave resonator 102. For the amplifier 138, for example, a power amplifier of an order of 1 kW (for example, a Travelling Wave Tube Amplifier (TWTA)) is used. The static magnetic field generated by the electromagnets 104 is fixed during one spin echo and during measurement of FID. For the spin echo and FID, integration processing is executed one or more times under a fixed static magnetic field. When ESR phenomenon is caused with the irradiation of the microwave pulse, a reflected microwave is extracted through the circulator 118. When the pulse ESR is executed, a path 122b is formed by the switch 120. In addition, during the measurement, a switch 140 is switched ON. The reflected microwave is supplied through the path 122b and the switch 140 to an amplifier 142. The reflected microwave which is amplified by the amplifier 142 is supplied to a phase demodulator 144. The phase demodulator 144 is a quadrature demodulator, and executes quadrature demodulation (orthogonal phase demodulation) using a reference signal sent through the phase shifter 124. With such a configuration, a real signal component 146 and an imaginary signal component 148 are obtained. With respect to these signal components, a process such as, for example, Fourier transform is applied. According to the pulse ESR, the spin echo and an FID signal are observed. For example, by irradiating a 180° pulse ($\pi$ pulse) after irradiation of a 90° pulse ($\pi/2$ pulse), the spin echo is observed.

In the ESR apparatus shown in FIG. 7, a magnetization component (My component) orthogonal to the static magnetic field is detected. As other methods, methods of detecting physical quantities other than the My component are known. For example, longitudinally detected ESR (LOD-ESR), electrically detected magnetic resonance (EDMR), optically detected magnetic resonance (ODMR), and the like are known. These methods may be considered indirect ESR in a sense that physical quantities other than the My component are detected. FIG. 8 shows an ESR apparatus which realizes these methods.

First, the longitudinally detected ESR will be explained. In the longitudinally detected ESR, a change of an Mz component of electron spin (magnetization component parallel to the static magnetic field) is detected. For this purpose, a pickup coil 150 in which a wiring axis is placed in a direction parallel to the static magnetic field is placed near the sample 100. A microwave generated by the microwave oscillator 108 is attenuated by the attenuator 110 to a predetermined electric power, and is then supplied to a switch 156. Meanwhile, an oscillator 152 generates a reference signal having a modulation frequency. The reference signal is supplied through the switch 154 to a switch 156. The switch 156 repeats the ON and OFF states according to a modulation frequency. With such a configuration, the microwave is modulated according to the modulation frequency. The modulated microwave is supplied through the circulator 118 to the microwave resonator 102. When the ESR phenomenon is caused due to the sweeping of the static magnetic field, the Mz component of the electron spin changes, and an induced voltage is generated at the pickup coil 150. The induced voltage is amplified by an amplifier 158, and is supplied to a phase demodulator 160. The change of the induced voltage is synchronous with the modulation frequency. Therefore, lock-in demodulation is executed by the phase demodulator 160 (for example, PSD) using the reference signal supplied from the oscillator 152. A signal which is output from the phase demodulator 160 passes through a low-pass filter 161, and, with this process, a longitudinally detected ESR signal (LOD-ESR signal) 162 is obtained. With the use of the longitudinally detected ESR, it is also possible to observe a longitudinal relaxation time T1 (spin lattice relaxation time).

Next, the electrically detected magnetic resonance will be explained. The electrically detected magnetic resonance is a method in which a current (voltage) is applied to the sample 100 by a voltage supply and detection device 170, and a change of a current flowing in the sample 100 is detected. In this method, a microwave generated by the microwave oscillator 108 is modulated according to the modulation frequency by a switching operation of the switch 156. Alternatively, the microwave is not modulated, but the magnetic field is modulated. In this case, an AC current generated by the oscillator 152 is supplied through the switch 154 to the magnetic field modulation coil 106. The microwave is supplied through the circulator 118 to the microwave resonator 102, and, when the ESR phenomenon is caused as a result of the sweeping of the static magnetic field, the current flowing in the sample 100 changes. The current is detected by the voltage supply and detection device 170. A signal indicating an amount of this change is amplified, and is supplied to the phase demodulator 172. The change of the current is synchronous with the modulation frequency. Therefore, lock-in demodulation is executed by the phase demodulator 172 (for example, PSD) using the reference signal supplied from the oscillator 152. A signal which is output from the phase demodulator 172 passes through a low-pass filter 173, and, with this process, an EDMR signal 174 is obtained. With the use of the electrically detected magnetic resonance, it becomes possible to detect an electron spin resonance contributing to the change of the current. For example, a diode is used as the sample 100, and a defect of a semiconductor is observed.

Next, the optically detected magnetic resonance will be explained. The optically detected magnetic resonance is a method in which light is irradiated from a light source 180 onto a sample 100, and a change of an amount of light absorption by the sample 100 is detected. In this method, the microwave or the magnetic field is modulated, similar to the case of the electrically detected magnetic resonance. When the microwave is supplied through the circulator 118 to the microwave resonator 102, and the ESR phenomenon is caused as a result of the sweeping of the static magnetic field, an amount of absorption of light by the sample 100 changes. The light from the sample 100 is detected by an optical detector 182. A signal showing an amount of this change is supplied to a phase demodulator 184. The change of the amount of light absorption is synchronous to the modulation frequency. Therefore, lock-in demodulation is executed by the phase demodulator 184 (for example, PSD) using a reference signal supplied from the oscillator 152. A signal which is output from the phase demodulator 184 passes through a low-pass filter 185, and, with this process, an ODMR signal 186 is obtained.

In the ESR apparatus shown in FIG. 8, the continuous wave ESR is applied. Alternatively, the pulse ESR may be applied.

In addition, there is known a method in which the pulse ESR and the continuous wave ESR are combined, known as a hybrid ESR. In this measurement method, an electron spin resonance is excited by a microwave pulse, and the ESR signal is detected by lock-in demodulation. For example, in the pulsed LOD ESR described in a reference, A. Schweiger, R. Ernst, J., Magn. Reson. 77, 512 (1988), a pulse sequence that induces a change of magnetization in the Mz direction is executed, and a microwave pulse is supplied into the microwave resonator. For example, a 180° pulse (π pulse) is supplied according to a repetition frequency. A detection signal indicating an induced voltage from a pickup coil placed near the sample is lock-in demodulated using the repetition frequency of the pulse sequence. With such a configuration, a longitudinally detected ESR signal is obtained.

A reference, D. Lepine, Phys. Rev. B, Vol. 6, No. 2, 436 (1972), discloses a technique in the electrically detected magnetic resonance in which a change of intensity of the EDMR signal is recorded using the modulation frequency as a variable.

In a method in which the irradiation of the microwave pulse and the lock-in demodulation are combined such as the hybrid ESR described above, a problem may arise when the repetition frequency of the pulse sequence is changed. For example, there may be cases where it is desired to change the repetition frequency of the pulse sequence according to the sample or the measurement details. When a sample having a short relaxation time is to be measured, it may be desired to shorten the repetition frequency of the pulse sequence in order to shorten a wait time of measurement and to consequently improve measurement efficiency. On the other hand, when a sample having a long relaxation time is to be measured, it is necessary to increase the repetition period according to the duration of the relaxation time. The repetition frequency of the pulse sequence corresponds to a repetition frequency used in the lock-in demodulation. Because of this, when the repetition frequency of the pulse sequence is changed, the repetition frequency used in the lock-in demodulation must also be changed according to the change of the repetition frequency of the pulse sequence. However, when the repetition frequency used in the lock-in demodulation is changed, a frequency characteristic of a circuit must be changed. For example, in the longitudinally detected ESR, the resonance frequency of the pickup coil or the like must be changed every time the repetition frequency is changed. In addition, it becomes necessary to design the frequency characteristics of the resonance circuit and the amplifier to have a very wide range, or to replace the circuit itself.

An advantage of the present invention is that the lock-in demodulation is enabled without changing the frequency used in the lock-in demodulation even when the repetition frequency of the pulse sequence is changed in an electron spin resonance apparatus. An alternative advantage of the present invention is that the pulse sequence is repeated accurately.

SUMMARY

According to one aspect of the present invention, there is provided an electron spin resonance apparatus comprising: a microwave generator that generates a microwave signal; a pulse train signal generator that generates a pulse train signal according to a modulation frequency Fm and a repetition frequency Fp of a pulse sequence; an excitation signal generator that applies the pulse train signal on the microwave signal to generate an excitation signal; an electron spin resonance chamber that houses a sample and to which the excitation signal is sent; and a demodulator that executes a lock-in demodulation using the modulation frequency Fm on a detection signal reflecting electron spin resonance caused in the sample, to generate an analysis target signal, wherein the repetition frequency Fp and the modulation frequency Fm are in a relationship Fp=2n×Fm, wherein n is an integer greater than or equal to 1.

According to the above-described configuration, a pulse train signal according to a modulation frequency Fm and a repetition frequency Fp is applied to a microwave signal, to generate an excitation signal. The excitation signal is used to excite an electron spin resonance. A detection signal reflecting the electron spin resonance changes synchronously with the modulation frequency Fm (that is, according to the frequency component of Fm). Thus, lock-in demodulation is executed using the modulation frequency Fm on the detection signal. In the above-described configuration, the repetition frequency Fp of the pulse sequence is not used for the lock-in demodulation, and the modulation frequency Fm is used for the lock-in demodulation. In other words, the modulation frequency Fm which is different from the repetition frequency Fp which defines the repetition of the pulse sequence is used for the lock-in demodulation, and thus, even when the repetition frequency Fp is changed, the lock-in demodulation can be executed without changing the modulation frequency Fm.

In addition, in the above-described configuration, the repetition frequency Fp and the modulation frequency Fm are in the relationship of Fp=2n×Fm. In other words, the repetition frequency Fp is an even-number multiple of the modulation frequency Fm. For example, the repetition frequency Fp and the integer n are changed according to the sample and the measurement details. By satisfying the above-described relationship, it becomes possible not to include a fractional pulse sequence in the pulse train signal according to the modulation frequency Fm, and to accurately repeat the pulse sequence according to the repetition frequency Fp.

The above-described electron spin resonance apparatus is used, for example, for detection methods such as the longitudinally detected ESR, the electrically detected magnetic resonance, the optically detected magnetic resonance, or the like. Alternatively, the above-described electron spin resonance apparatus may be applied to other detection methods.

According to another aspect of the present invention, there is provided an electron spin resonance apparatus comprising: a microwave generator that generates a microwave signal; a pulse train signal generator that generates a pulse train signal in which a reference pulse train is repeated with a repetition frequency Fp and which is modulated by a modulation signal having a modulation frequency Fm; an excitation signal generator that modulates the microwave signal with the pulse train signal to generate an excitation signal; an electron spin resonance chamber that houses a sample and to which the excitation signal is supplied; a detector that generates a detection signal reflecting electron spin resonance caused in the sample; and a demodulator that executes a lock-in demodulation on the detection signal based on the modulation signal, to generate an analysis target signal, wherein the repetition frequency Fp and the modulation frequency Fm are in a relationship Fp=2n×Fm, wherein n is an integer greater than or equal to 1, and the repetition of the reference pulse train and the modulation by the modulation signal are synchronous with each other.

According to another aspect of the present invention, preferably, the pulse train signal generator comprises: a pulse pattern generator that repeatedly generates a pulse pattern forming the pulse sequence according to the repetition frequency Fp; a modulation signal generator that generates a modulation signal which is repeatedly switched ON and OFF with the modulation frequency Fm; and a generator that applies the modulation signal on an original pulse train in which the pulse patterns are combined, to generate the pulse train signal.

In the above-described configuration, an original pulse train; that is, a pulse sequence, is modulated according to the modulation frequency Fm. With such a configuration, the pulse train signal includes the pulse sequence when the modulation signal is in the ON state, and does not include the pulse sequence when the modulation signal is in the OFF state. When the above-described relationship is satisfied, the number of pulse sequences when the modulation signal is in the ON state is an integer, and no fractional pulse sequence would be included in the pulse train signal. Therefore, in the modulation also, the pulse sequence can be accurately repeated according to the repetition frequency Fp.

According to another aspect of the present invention, preferably, the pulse pattern generator and the modulation signal generator operate synchronously with each other.

According to another aspect of the present invention, preferably, the repetition frequency Fp is variably set according to a measurement situation under a condition where the modulation frequency Fm is fixed.

According to another aspect of the present invention, preferably, the detection signal is detected by one of detection of longitudinal magnetization in the sample, detection of an electric characteristic in the sample, and detection of an optical characteristic in the sample. Alternatively, the detection signal may be detected by other detection methods.

According to another aspect of the present invention, preferably, the pulse pattern includes two pulses having a time interval $\tau$, and the electron spin resonance apparatus further comprises a function to change the time interval $\tau$ for each measurement. Each pulse is, for example, a 180° pulse ($\pi$ pulse), a 90° pulse ($\pi/2$ pulse), or the like. Alternatively, other pulses may be employed. The pulse pattern is used, for example, in the longitudinally detected ESR. By the irradiation of a microwave corresponding to each pulse, the electron spin state changes from the equilibrium state. The magnetization Mz is relaxed toward the equilibrium state according to the longitudinal relaxation time T1, and the degree of the relaxation is detected. By changing the time interval $\tau$, the degree of relaxation changes. The change may then be detected, and the physical properties of the sample may be identified.

According to various aspects of the present invention, even when the repetition frequency of the pulse sequence is changed, the lock-in demodulation of the ESR signal can be executed without changing the frequency used in the lock-in demodulation. In addition, with a sequence by a combination of synchronized signals (harmonic modulated sequence), it becomes possible to accurately repeat the pulse sequence. Furthermore, by combining a power amplifier having no limitation in the duty ratio and the harmonic modulated sequence, it becomes possible to execute the pulse sequence at a duty ratio higher than in the case of the pulse LOD method of the related art. With the realization of the higher duty ratio, it becomes possible to increase the signal intensity of the LOD signal.

BRIEF DESCRIPTION OF THE DRAWINGS

Preferred embodiments of the present invention will be described in detail with reference to the following figures, wherein.

DESCRIPTION OF EXEMPLARY EMBODIMENTS

First Preferred Embodiment

Figure 1:
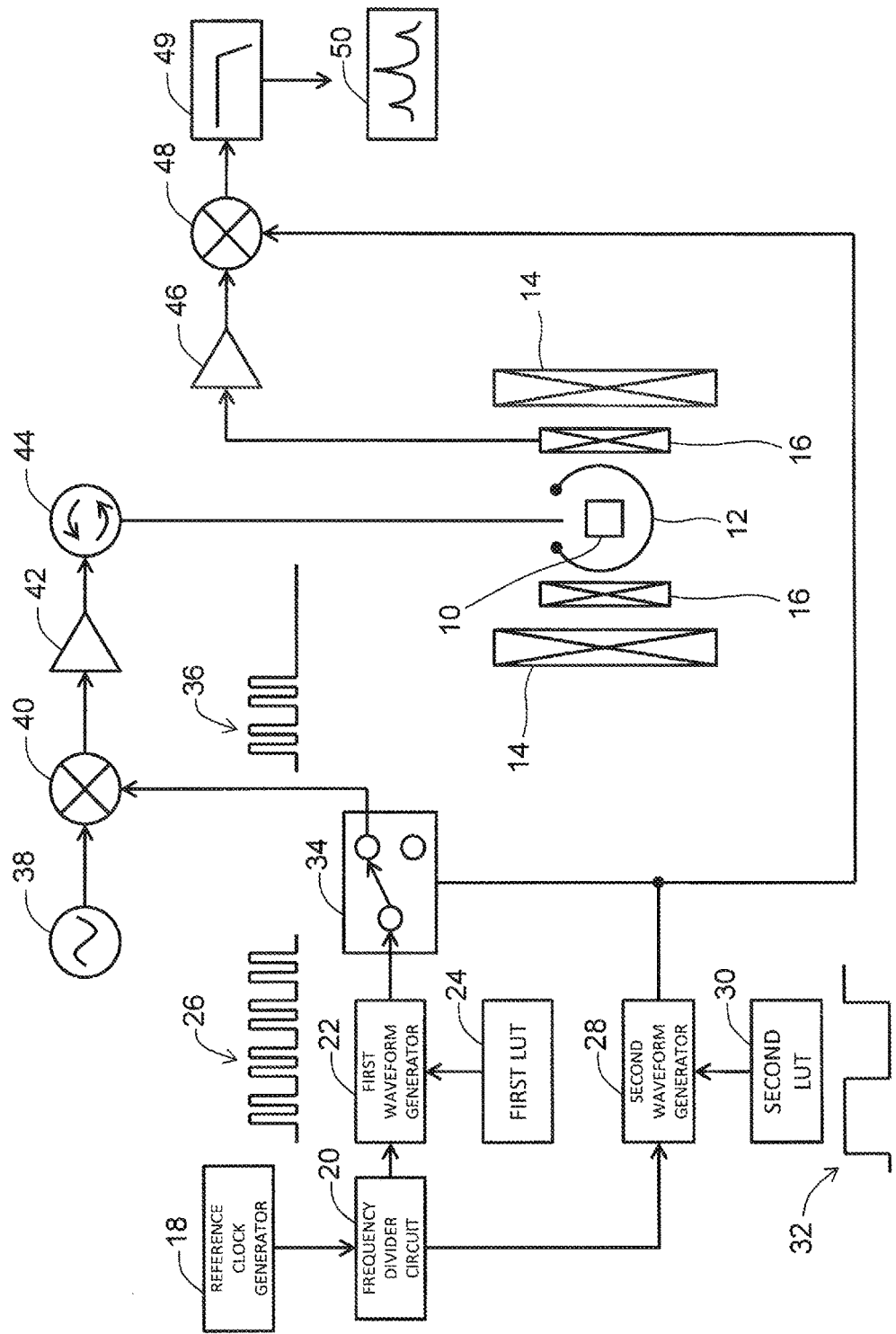
FIG. 1 is a block diagram showing an example ESR apparatus according to a first preferred embodiment of the present invention.

FIG. 1 shows an example electron spin resonance apparatus (ESR apparatus) according to a first preferred embodiment of the present invention. The ESR apparatus is an apparatus that realizes the longitudinally detected ESR (LOD-ESR). The ESR apparatus according to the first preferred embodiment excites electron spin resonance by a modulated microwave, and detects a longitudinally detected ESR signal (LOD-ESR signal) by phase demodulation (lock-in demodulation).

A sample tube having a sample 10 placed inside is inserted into a microwave resonator 12. The sample 10 may be any of gas, solid, and liquid. The microwave resonator 12 is placed between two electromagnets 14. With this configuration, the microwave resonator 12 is placed in a static magnetic field generated by the electromagnets 14. In addition, a pickup coil 16 having a wiring axis placed in a direction parallel to the static magnetic field is placed near the sample 10. In some cases, a coolant such as helium may be supplied into the sample tube, to cool the sample 10.

A reference clock generator generates a reference clock. The reference clock is frequency-divided by a frequency divider circuit 20, and is supplied to a first waveform generator 22 and a second waveform generator 28.

The first waveform generator 22 has a function to refer to a first LUT 24 (first lookup table 24) to generate an arbitrary waveform. In the present embodiment, the first waveform generator 22 repeatedly generates a pulse pattern forming a pulse sequence according to a repetition frequency Fp. With this configuration, an original pulse train 26 in which the pulse patterns are combined is generated. The original pulse train 26 is supplied to a switch 34.

The second waveform generator 28 has a function to refer to a second LUT 30 (second lookup table 30) to generate an arbitrary waveform. In the present embodiment, the second waveform generator 28 generates a modulation signal 32 which repeats the ON and OFF states at a modulation frequency Fm (repetition frequency Fm). The first waveform generator 22 and the second waveform generator 28 operate synchronously. The modulation signal 32 is supplied to the switch 34. The modulation frequency Fm is, for example, about 100 kHz. This configuration, however, is exemplary, and the modulation frequency Fm may be a frequency other than 100 kHz.

The switch 34 applies the modulation signal 32 on the original pulse train 26, to generate a pulse train signal 36. More specifically, the switch 34 repeats the ON and OFF states according to the modulation frequency Fm of the modulation signal 32. With such a configuration, the original pulse train 26 is modulated according to the modulation frequency Fm and the pulse train signal 36 is generated. The pulse train signal 36 is a pulse train signal according to the repetition frequency Fp of the pulse sequence and the modulation frequency Fm. The pulse train signal 36 is supplied to a mixer 40.

In the present embodiment, the repetition frequency Fp and the modulation frequency Fm are in a relationship Fp=2n×Fm (wherein n is an integer greater than or equal to 1). Thus, the repetition period Ta of the pulse sequence (1/Fp) and the repetition period Tb of the modulation signal 32 (1/Fm) are in a relationship Tb=2n×Ta. With such a configuration, n (integer number) pulse sequences are included in a half period of the repetition period Tb (Tb/2). Here, n is a variable, and can be changed, for example, according to the sample and the measurement details.

For example, the modulation frequency Fm is fixed. Under such a condition, the repetition frequency Fp is variably set according to the sample and the measurement details. Alternatively, the modulation frequency Fm may be changed. The change of the repetition frequency Fp may be achieved by changing a reading period of the pulse pattern data by the first LUT 24, and, for this purpose, information designating the reading period may be supplied from a controller (not shown) to the first waveform generator 22. Similarly, the modulation frequency Fm may be changed by supplying information designating the reading period from the controller to the second waveform generator 28.

The mixer 40 modulates, by the pulse train signal 36, the microwave generated by the microwave oscillator 38. With this process, an excitation signal is generated.

The excitation signal which is output from the mixer 40 is amplified by an amplifier 42, and is supplied to the microwave resonator 12 through a circulator 44. The amplifier 42 is formed from a power amplifier which can continuously amplify a signal. For example, a power amplifier of a small electric power (low power) such as those used in the continuous wave ESR is used. Alternatively, if the signal can be continuously amplified, a power amplifier of a large electric power (high power) may be used.

A static magnetic field is swept by the electromagnets 14. The sweeping may be executed continuously or in a stepwise manner. When the ESR phenomenon is caused as a result of the sweeping of the static magnetic field, the Mz component of the electron spin (magnetization component parallel to the static magnetic field) is changed, and, with this process, an induced voltage is generated in the pickup coil 16. A detection signal indicating the induced voltage is amplified by an amplifier 46, and is supplied to a phase demodulator 48. A change in the induced voltage is synchronous to the modulation frequency Fm. Circuits from the pickup coil 16 to the phase demodulator 48 form tuned circuits, and are tuned to the modulation frequency Fm.

The phase demodulator 48 is, for example, a PSD (Phase Sensitive Detector). The phase demodulator 48 applies a phase demodulation (lock-in demodulation) on the detection signal using the modulation signal 32 supplied from the second wave generator 28. A signal which is output from the phase demodulator 48 passes through a low-pass filter 49, and, with this process, a longitudinally detected ESR signal (LOD-ESR signal) 50 is obtained.

Next, referring to FIGS. 2A-2D, specific examples of the original pulse train 26, the modulation signal 32, the pulse train signal 36, and the detection signal will be explained.

Figure 2:
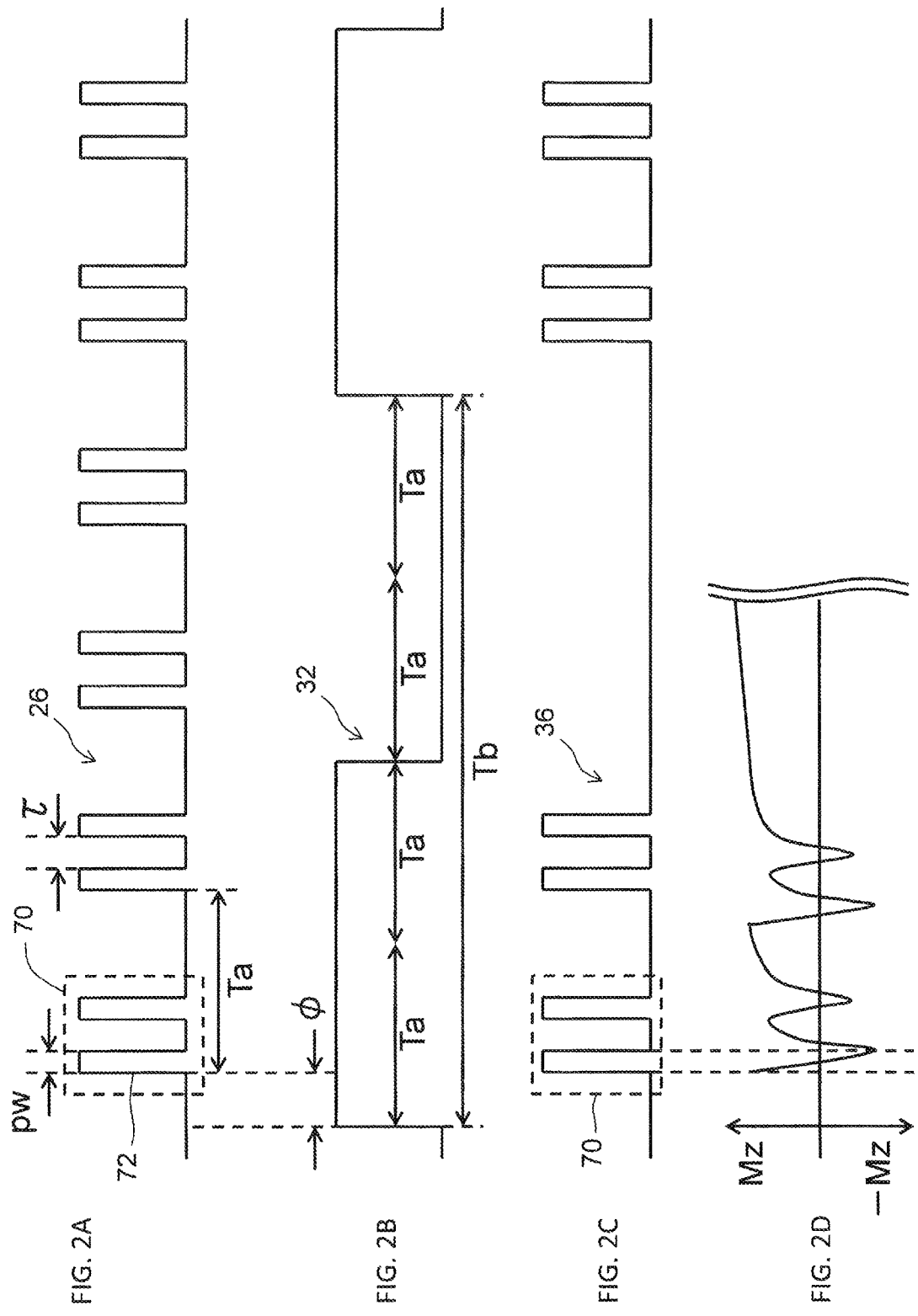
FIG. 2A is a diagram showing an example pulse sequence.
FIG. 2B is a diagram showing an example pulse sequence.
FIG. 2C is a diagram showing an example pulse sequence.
FIG. 2D is a diagram showing an example pulse sequence.

FIG. 2A shows an example of the original pulse train 26. The original pulse train 26 includes a plurality of pulse patterns 70. The pulse pattern 70 is repeatedly generated according to the repetition frequency Fp. In other words, the pulse pattern 70 is repeatedly generated at every repetition period Ta. The pulse pattern 70 includes, as an example, two pulses 72 having a time interval $\tau$. Each pulse 72 has a pulse width pw. Each pulse 72 is a pulse that induces a change of magnetization in the Mz direction, and is, for example, a 180° pulse ($\pi$ pulse). Alternatively, each pulse 72 may be a pulse other than the 180° pulse (for example, a 90° pulse or other pulses).

FIG. 2B shows an example of the modulation signal 32. The modulation signal 32 is a signal which repeats the ON and OFF states according to the modulation frequency Fm (repetition period Tb).

In the present embodiment, the repetition periods Ta and Tb are in a relationship Tb=2n×Ta (wherein n is an integer greater than or equal to 1). In the example configuration shown in FIGS. 2A and 2B, n=2, and the repetition periods Ta and Tb are in the relationship Tb=4×Ta. In other words, two pulse patterns 70 are included in a period of (Tb/2). In addition, a phase difference $\varphi$ between the original pulse train 26 and the modulation signal 32, for example, is fixed at a constant value.

FIG. 2C shows an example of the pulse train signal 36. The pulse train signal 36 is generated by modulating the original pulse train 26 according to the modulation frequency Fm. Specifically, the pulse pattern 70 is output from the switch 34 when the modulation signal 32 is in the ON state, and, with this process, the pulse train signal 36 is generated. The pulse train signal 36 is a pulse train signal according to the repetition frequency Fp (repetition period Ta) of the pulse sequence, and, at the same time, according to the modulation frequency Fm (repetition period Tb) of the modulation signal 32. In the present embodiment, the original pulse train 26 is modulated by the modulation signal 32 having the repetition period Tb which is 2n times the repetition period Ta of the original pulse train 26, so that the pulse train signal 36 is generated. Because of this, the pulse train signal 36 may be called a harmonic modulated sequence. The microwave generated by the microwave oscillator 38 is modulated by the pulse train signal 36, and is supplied to the microwave resonator 12.

FIG. 2D shows a response of the electron spin resonance excited by the harmonic modulated sequence. In the longitudinally detected ESR, a change of the Mz component (magnetization component parallel to the static magnetic field) of the electron spin appears as a response of the electron spin resonance. A response waveform of the Mz component may be considered as a signal modulated by the modulation frequency Fm of the modulation signal 32. Therefore, by applying the lock-in demodulation according to the modulation frequency Fm, the longitudinally detected ESR signal is obtained.

Next, a technical meaning of the two pulses 72 included in the pulse pattern 70 will be explained. Because two pulses 72 are used, this method is called a two-pulse method. When a microwave corresponding to the first pulse 72 is irradiated, the electron spin state is changed from the equilibrium state, and then, the magnetization Mz is relaxed toward the equilibrium state according to the longitudinal relaxation time T1. The course of the relaxation of the magnetization Mz appears as a change in the induced voltage. In the course of the relaxation, a microwave corresponding to the second pulse 72 is irradiated. With such a process, the relaxation course is changed. When the time interval $\tau$ is changed, the slope of the relaxation of the magnetization Mz changes, and the size of the induced voltage detected by the pickup coil 16; that is, the intensity of the magnetization Mz (intensity of the ESR signal), changes. A phenomenon is observed in which, as the time interval $\tau$ is elongated, the induced voltage is reduced (attenuated). The second pulse 72 may be called a detection pulse because the pulse is used to detect the degree of relaxation of the magnetization Mz. The degree of attenuation of the induced voltage varies depending on the substance. Thus, by executing measurement a plurality of times with different time intervals $\tau$ and measuring the degree of attenuation of the induced voltage, it becomes possible to identify the substance. In the present embodiment, the first waveform generator 22 generates the original pulse train 26 having a different time interval $\tau$ at each measurement, based on a control signal from the controller (not shown). With such a configuration, an induced voltage having the time interval $\tau$ as a variable is obtained.

As for the pulse 72, the pulse 72 may be a pulse other than the 180° pulse, so long as the pulse 72 is a pulse that allows change of the magnetization Mz and subsequent measurement of the longitudinal relaxation time T1.

According to the ESR apparatus of the present embodiment, by changing the variable of the pulse sequence, measurement according to the sample and the measurement details can be executed. For example, the pulse width pw, the time interval $\tau$, and the repetition frequency Fp (repetition period Ta) of the pulse 72 may be changed and the measurement may be executed, to enable measurement according to the sample and the measurement details. When the longitudinal relaxation time T1 of the sample 10 is short, the repetition period Ta may be shortened according to the duration of the relaxation time T1, and the measurement may be repeated, to thereby shorten the wait time of the measurement and improve measurement efficiency. When the longitudinal relaxation time T1 of the sample 10 is long, the repetition period Ta may be elongated according to the duration of the relaxation time T1, to thereby enable measurement corresponding to the duration of the relaxation time T1. In the present embodiment, the pulse sequence is modulated using the modulation signal 32, and the lock-in demodulation is executed using the modulation frequency Fm of the modulation signal 32. Because of this, even when the variable of the pulse sequence is changed, the modulation frequency Fm used in the lock-in demodulation does not need to be changed. In other words, even when the pulse width pw, the time interval τ, and the repetition frequency Fp are changed, the lock-in demodulation can be executed without changing the modulation frequency Fm (repetition period Tb). Because the modulation frequency Fm used in the lock-in demodulation does not need to be changed, the frequency characteristic of the circuit of the ESR apparatus does not need to be changed.

In the hybrid ESR of the related art, the lock-in demodulation is executed according to a reference frequency synchronous with the repetition frequency Fp (repetition period Ta) of the pulse sequence. Therefore, in the related art, the pulse pattern 70 forming the pulse sequence is not modulated. Specifically, in the related art, the modulation signal 32 for modulating the original pulse train 26 is not used. In the related art, when the repetition frequency Fp (repetition period Ta) of the pulse sequence is changed, the reference frequency used in the lock-in demodulation must also be changed according to the change of the repetition frequency Fp. In this case, the frequency characteristic of the circuit must also be changed. On the contrary, in the present embodiment, as described above, the modulation frequency Fm used in the lock-in demodulation does not need to be changed.

In addition, in the present embodiment, the repetition frequency Fp and the modulation frequency Fm are in the relationship Fp=2n×Fm. In other words, the repetition frequency Fp is an integral multiple of the modulation frequency Fm. With such a configuration, the phase of the pulse sequence can be matched, and the pulse sequence can be repeated accurately. Specifically, the pulse sequence is output when the modulation signal 32 is in the ON state, and the pulse sequence is not output when the modulation signal 32 is in the OFF state. When the above-described relationship is satisfied, the number of pulse sequences when the modulation signal 32 is in the ON state is an integer, and no fractional pulse sequence would be included in the pulse train signal 36. In the example configuration shown in FIGS. 2A-2D, two pulse patterns 70 are included in the ON period (Tb/2) of the modulation signal 32. Therefore, even when the pulse sequence is modulated, the pulse sequence can be accurately repeated according to the repetition frequency Fp. This is similarly true for cases where the variable n is greater than or equal to 3.

For example, when n=3; that is, when the repetition periods Ta and Tb are in the relationship Tb=6×Ta, three pulse patterns 70 are included in the ON period (Tb/2). When n=4, four pulse patterns 70 are included, and when n=5, five pulse patterns 70 are included. This is similarly true for cases of n=6 or greater. Even in these cases, an integral number of pulse sequences are included in the ON period (Tb/2) of the modulation signal 32, and the pulse sequence can be accurately repeated according to the repetition frequency Fp. In addition, the lock-in demodulation may be executed with the modulation frequency Fm (repetition period Tb) of the modulation signal 32 fixed.

In addition, in the present embodiment, as the amplifier which amplifies the microwave, a power amplifier which can continuously amplify a signal is used. For example, as the amplifier 42, a power amplifier of a small electric power (low power) such as those used in the continuous wave ESR is used. With such a configuration, the repetition period Ta of the pulse sequence can be shortened, and a pulse sequence density (number of repetitions per unit time) on the time axis can be increased. As a result, the wait time of the measurement can be shortened and the measurement efficiency can be improved. When the power amplifier of small electric power is used, the energy of each individual pulse 72 would be small. In order to handle this, in the present embodiment, a plurality of pulses 72 (four pulses 72 in the example configuration shown in FIG. 2A) are irradiated within the ON period (Tb/2). With such a configuration, the energy may be supplemented, and the signal intensity; that is, the detection sensitivity, can be strengthened. In other words, by irradiating a plurality of pulses 72, it becomes possible to improve detection sensitivity. Alternatively, so long as the signal can be continuously amplified, a power amplifier of a large electric power (high power) may be used. In the present embodiment, even in a case where such a power amplifier of a large electric power is not used and a power amplifier of a small electric power is used, degradation in detection sensitivity can be prevented or reduced.

Figure 7:
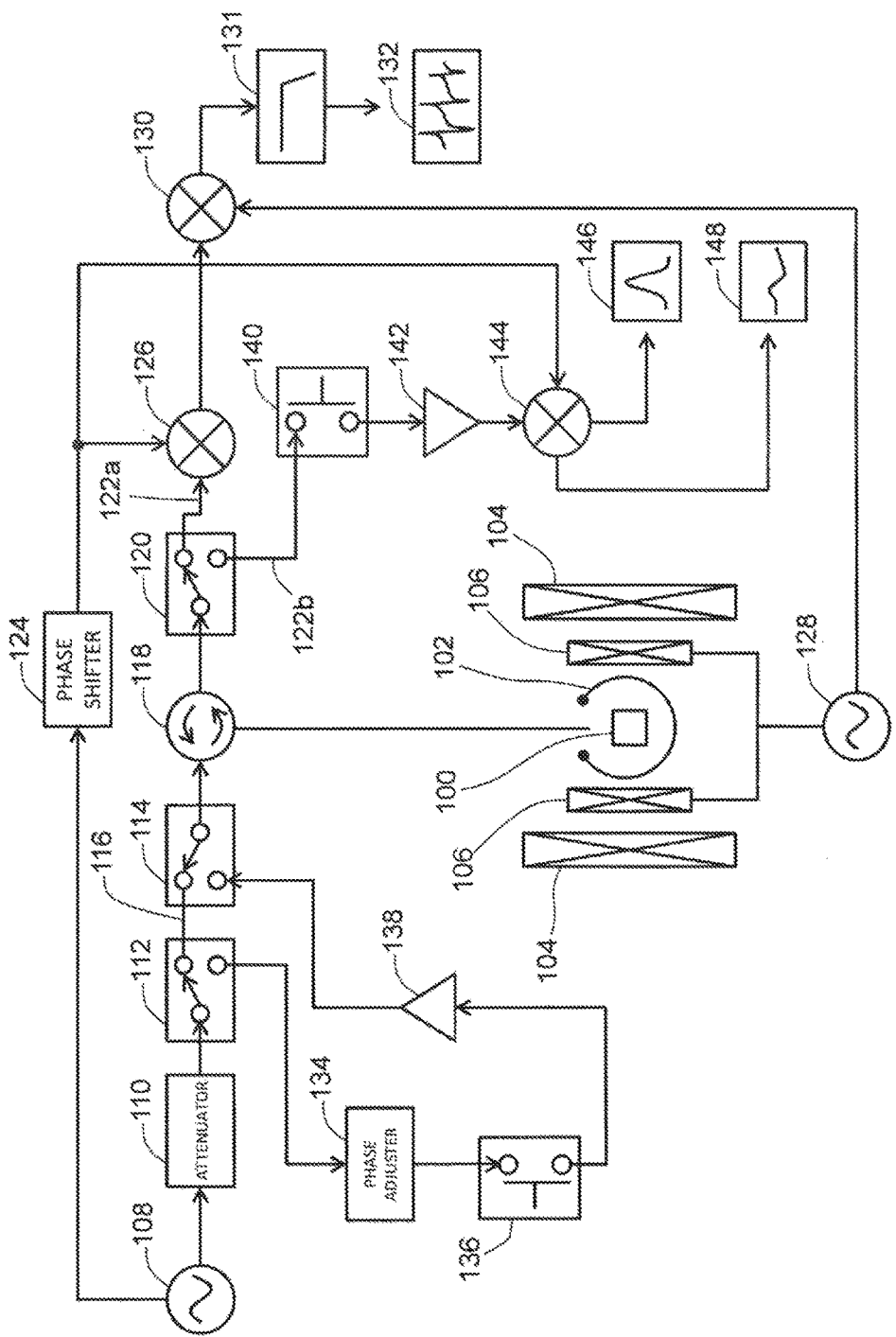
FIG. 7 is a block diagram showing an ESR apparatus according to related art.
Figure 8:
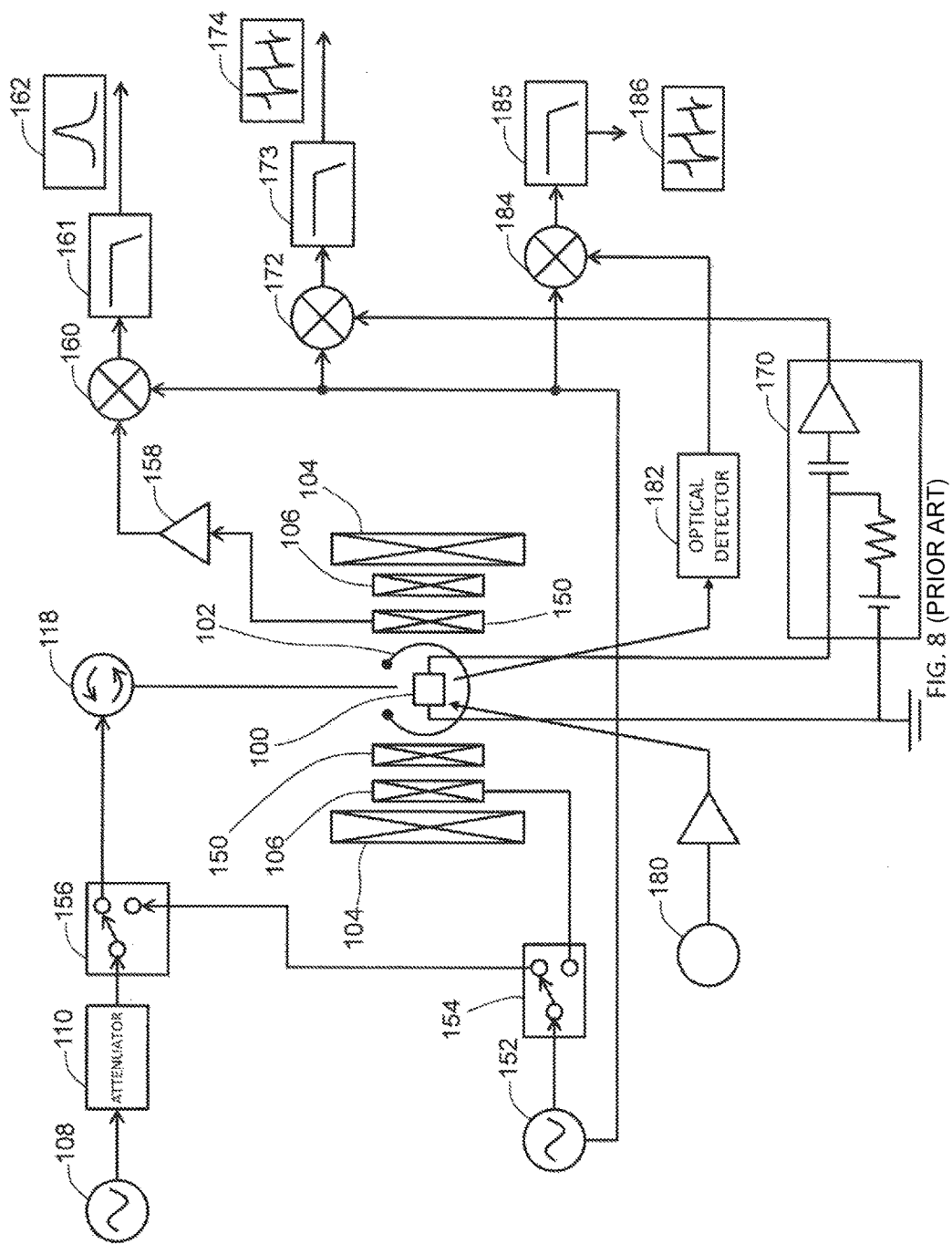
FIG. 8 is a block diagram showing an ESR apparatus according to related art.

In the pulse ESR of the related art (for example, the ESR apparatus shown in FIG. 7), it is necessary to irradiate a microwave pulse of a high power having a very short pulse width (for example, 10 ns) on the microwave resonator. Because of this, for the power amplifier which amplifies the microwave pulse, for example, a power amplifier of the order of 1 kW (for example, TWTA) is used. Such a power amplifier is designed to output a pulse of a high power with a short pulse width, and there is an upper limit in the ratio of the time in which the pulse can be output per unit time (duty ratio). The duty ratio is, for example, about 1-2%, and is very low. Because of this, there is a problem in that it is not possible to shorten the repetition period of the pulse sequence, to consequently increase the pulse sequence density on the time axis. On the contrary, according to the present embodiment, even when the power amplifier of the low power is used, degradation in the detection sensitivity can be prevented or reduced. Therefore, it becomes possible to increase the pulse sequence density on the time axis using the power amplifier of low power.

Alternatively, the modulation frequency Fm may be changed. For example, when a sample having a long relaxation time is to be measured, the modulation frequency Fm may be elongated according to the duration of the relaxation time.

Next, another example configuration of the pulse sequence will be explained. In the example configuration of FIGS. 2A-2D, two pulses 72 are included in the pulse pattern 70, but the number of pulses 72 is not limited to this number. One or a plurality of pulses 72 may be included in the pulse pattern 70.

Figure 3:
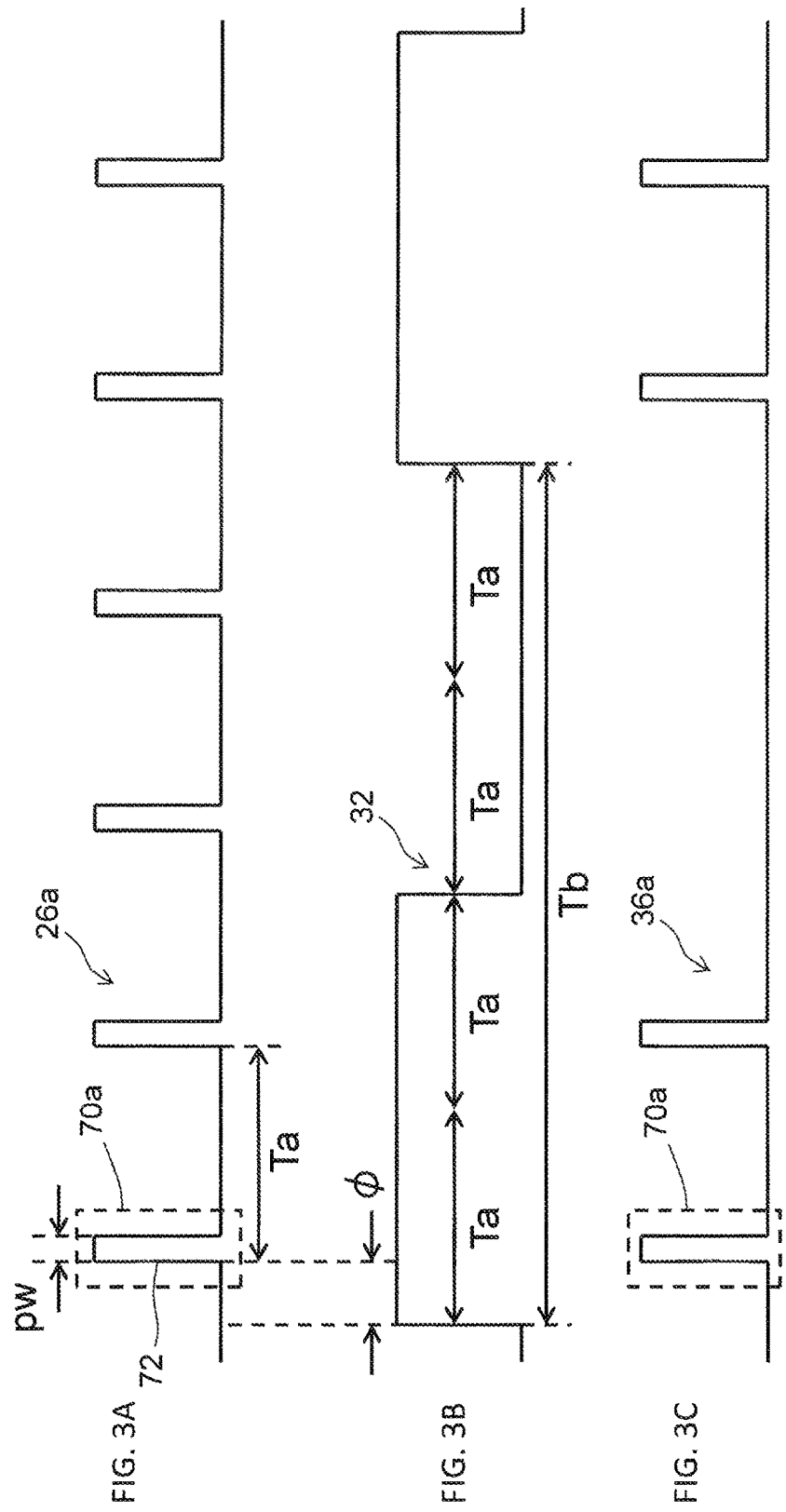
FIG. 3A is a diagram showing another example pulse sequence.
FIG. 3B is a diagram showing another example pulse sequence.
FIG. 3C is a diagram showing another example pulse sequence.

FIGS. 3A-3C show another example configuration of the pulse sequence. FIG. 3A shows an original pulse train 26a. The original pulse train 26a is a pulse train generated by the first waveform generator 22. The pulse pattern 70a is repeatedly generated according to the repetition frequency Fp. In other words, the pulse pattern 70a is repeatedly generated at every repetition period Ta. The pulse pattern 70a includes one pulse 72. Each pulse 72 has a pulse width pw. Depending on the sample and the measurement details, a case in which such an original pulse train 26a is generated is considered.

FIG. 3B shows the modulation signal 32. The modulation signal 32 is identical to the modulation signal 32 shown in FIG. 2B. The repetition periods Ta and Tb are in the relationship Tb=2n×Ta (wherein n is an integer greater than or equal to 1). In the example configuration shown in FIGS. 3A and 3B, the relationship Tb=4×Ta is satisfied. In other words, two pulse patterns 70a are included in the ON period (Tb/2) of the modulation signal 32.

FIG. 3C shows a pulse train signal 36a. The original pulse train 26a is modulated according to the modulation frequency Fm, so that the pulse train signal 36a is generated. The pulse train signal 36a also is a pulse train signal according to the repetition frequency Fp (repetition period Ta) of the pulse sequence and, at the same time, according to the modulation frequency Fm (repetition period Tb) of the modulation signal 32.

In the example configuration of FIGS. 3A-3C also, by changing the pulse width pw and the repetition frequency Fp while fixing the modulation frequency Fm (repetition period Tb), it becomes possible to execute measurement according to the sample and the measurement details. In addition, it becomes possible to accurately repeat the pulse sequence according to the repetition frequency Fp.

Figure 4:
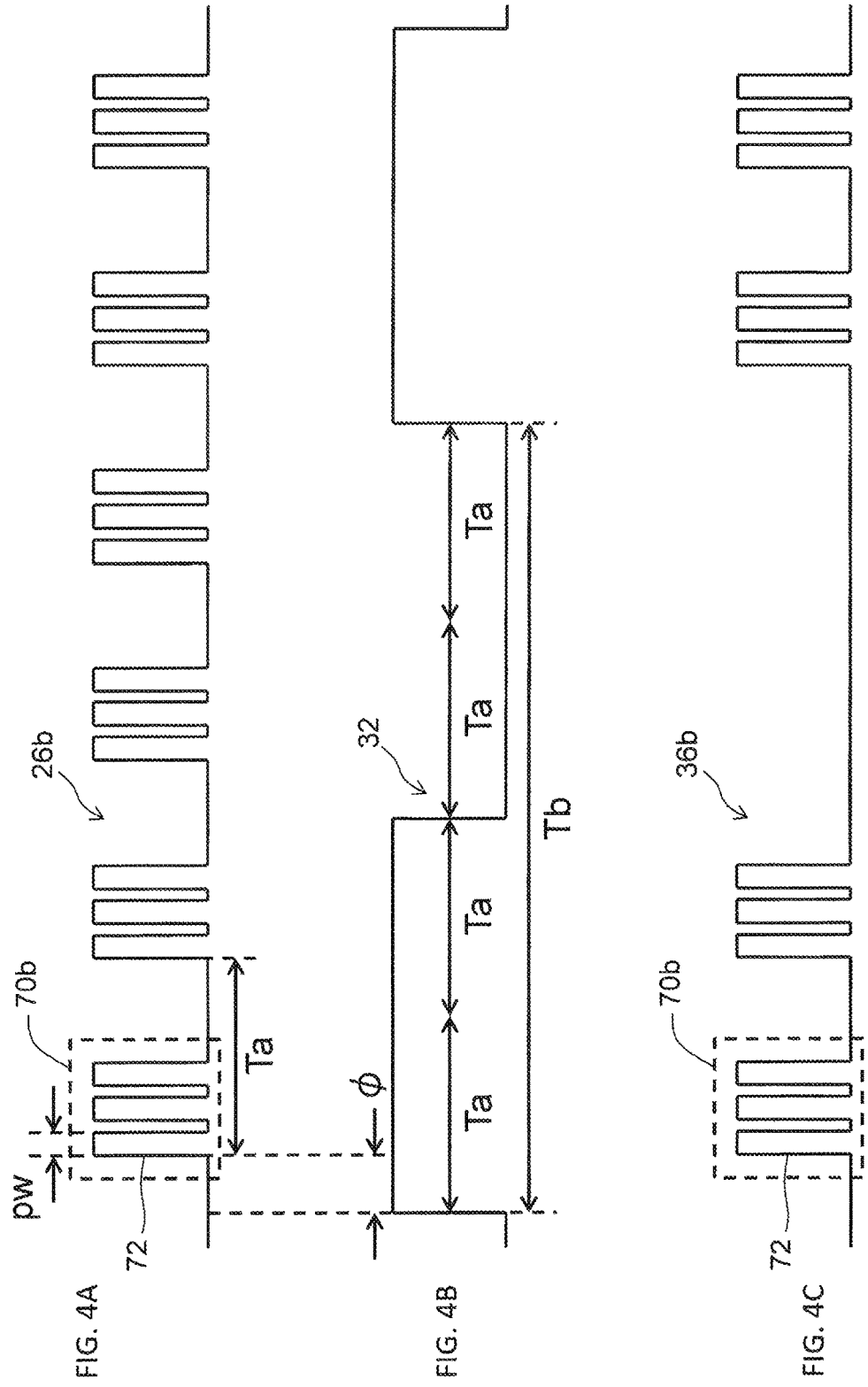
FIG. 4A is a diagram showing yet another example pulse sequence.
FIG. 4B is a diagram showing yet another example pulse sequence.
FIG. 4C is a diagram showing yet another example pulse sequence.

FIGS. 4A-4C show another example configuration of the pulse sequence. FIG. 4A shows an original pulse train 26b. The original pulse train 26b is a pulse train generated by the first waveform generator 22. The pulse pattern 70b is repeatedly generated according to the repetition frequency Fp. Specifically, the pulse pattern 70b is repeatedly generated at every repetition period Ta. The pulse pattern 70b includes three pulses 72 having a time interval. The time intervals between individual pulses 72 may be the same or different from each other. Each pulse 72 has a pulse width pw. Depending on the sample and the measurement details, a case in which such an original pulse train 26b is generated may be considered.

FIG. 4B shows the modulation signal 32. The modulation signal 32 is identical to the modulation signal 32 shown in FIG. 2B. The repetition periods Ta and Tb are in the relationship Tb=2n×Ta (wherein n is an integer greater than or equal to 1). In the example configuration of FIGS. 4A and 4B, the relationship Tb=4×Ta is satisfied. In other words, two pulse patterns 70b are included in the ON period (Tb/2) of the modulation signal 32.

FIG. 4C shows a pulse train signal 36b. The pulse train signal 36b is generated by modulating the original pulse train 26b according to the modulation frequency Fm. The pulse train signal 36b also is a pulse train signal according to the repetition frequency Fp (repetition period Ta) of the pulse sequence, and, at the same time, according to the modulation frequency Fm (repetition period Tb) of the modulation signal 32.

In the example configuration shown in FIGS. 4A-4C also, by changing the pulse width pw, the time interval τ, and the repetition frequency Fp while fixing the modulation frequency Fm (repetition period Tb), it becomes possible to execute measurement according to the sample and the measurement details. In addition, it becomes possible to accurately repeat the pulse sequence according to the repetition frequency Fp.

The pulse sequence to which the present embodiment is applied is not limited to the pulse sequences shown in FIGS. 2A-2D, FIGS. 3A-3C, and FIGS. 4A-4C. It is possible to use a pulse sequence corresponding to the sample and the measurement details. In this case, it is only necessary that the repetition frequency Fp and the modulation frequency Fm are in the relationship Fp=2n×Fm.

Second Embodiment

Figure 5:
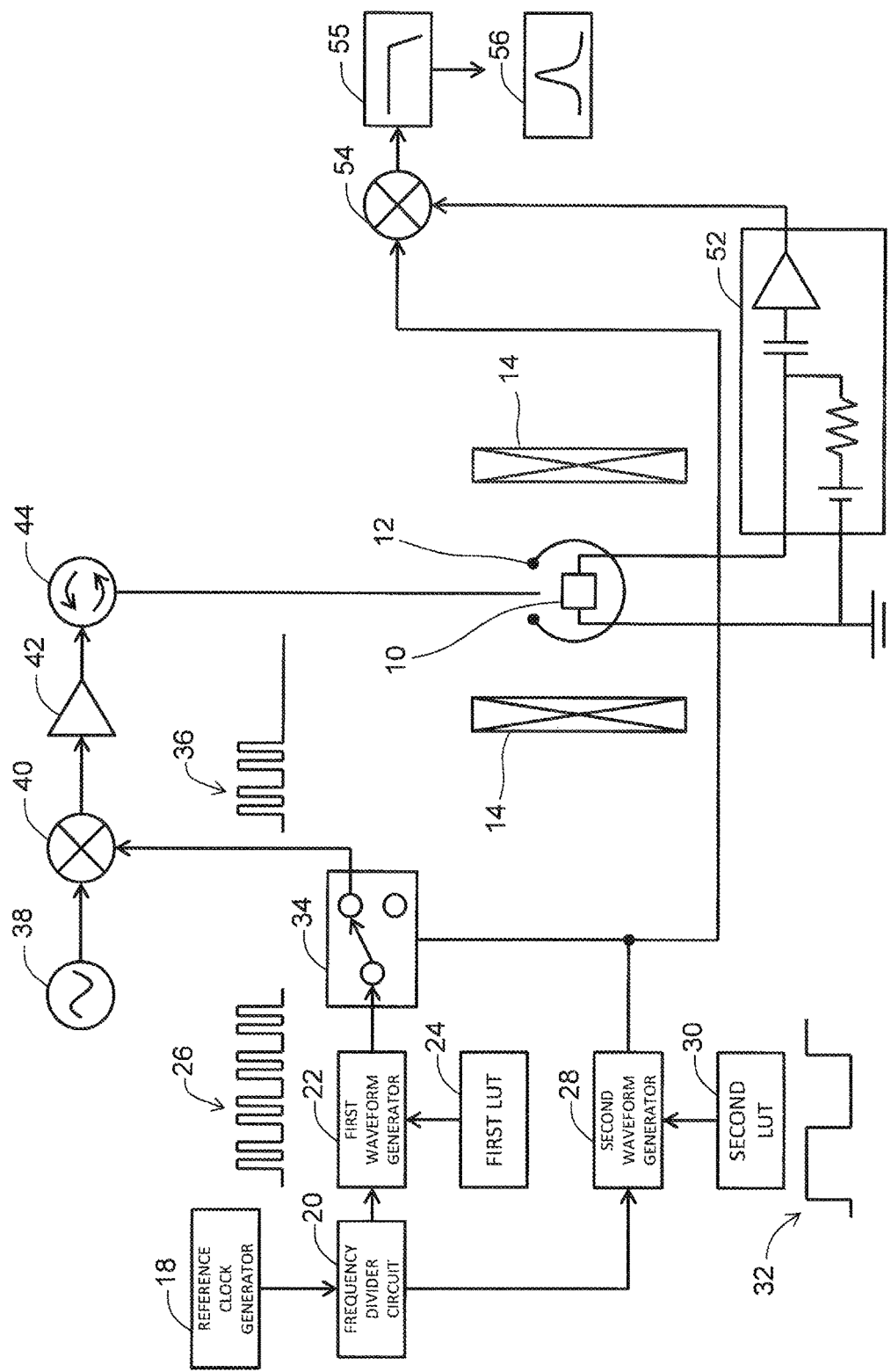
FIG. 5 is a block diagram showing an example ESR apparatus according to a second preferred embodiment of the present invention.

FIG. 5 shows an example ESR apparatus according to a second preferred embodiment of the present invention. This ESR apparatus is an apparatus that realizes the electrically detected magnetic resonance (EDMR). The ESR apparatus of the second preferred embodiment excites electron spin resonance by a modulated microwave, and detects the EDMR signal by lock-in demodulation.

In the second preferred embodiment, a current (voltage) is applied to the sample 10 by a voltage supply and detection device 52. In the second preferred embodiment also, the original pulse train 26 is modulated according to the modulation frequency Fm of the modulation signal 32, and, with this process, the pulse train signal 36 is generated. Similar to the first preferred embodiment, the repetition frequency Fp and the modulation frequency Fm are in the relationship Fp=2n×Fm.

A microwave generated by the microwave oscillator 38 is modulated by the pulse train signal 36, and, with this process, an excitation signal is generated. The excitation signal is supplied to the microwave resonator 12 through the circulator 44.

A static magnetic field is swept by the electromagnets 14, and, when the ESR phenomenon is caused as a result of the sweeping of the static magnetic field, the current flowing in the sample 10 changes. The current is detected by the voltage supply and detection device 52. A detection signal indicating an amount of this change is amplified and supplied to a phase demodulator 54. The change of the current is synchronous with the modulation frequency Fm.

The phase demodulator 54 is, for example, a PSD, and executes lock-in demodulation on the detection signal using the modulation signal 32 supplied from the second waveform generator 28. A signal which is output from the phase demodulator 54 passes through a low-pass filter 55, and, with this process, an EDMR signal 56 is obtained.

Third Preferred Embodiment

Figure 6:
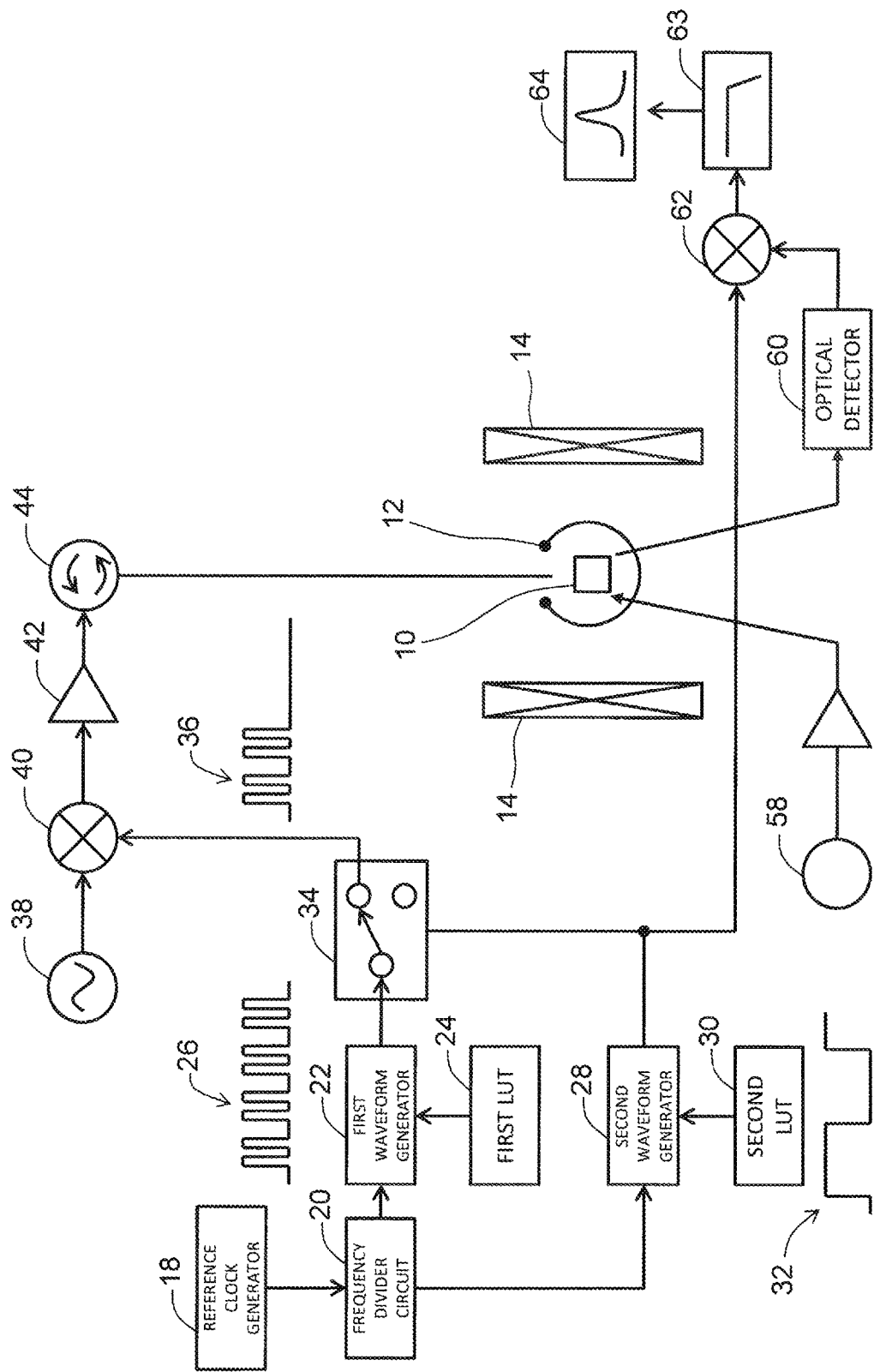
FIG. 6 is a block diagram showing an example ESR apparatus according to a third preferred embodiment of the present invention.

FIG. 6 shows an example ESR apparatus according to a third preferred embodiment of the present invention. This ESR apparatus is an apparatus which realizes optically detected magnetic resonance (ODMR). The ESR apparatus according to the third preferred embodiment excites electron spin resonance by a modulated microwave, and detects an ODMR signal by phase demodulation (lock-in demodulation).

In the third preferred embodiment, light is irradiated from a light source 58 to the sample 10. In the third preferred embodiment also, the original pulse train 26 is modulated according to the modulation frequency Fm of the modulation signal 32, and, with this process, the pulse train signal 36 is generated. Similar to the first preferred embodiment, the repetition frequency Fp and the modulation frequency Fm are in the relationship Fp=2n×Fm.

A microwave generated by the microwave oscillator 38 is modulated by the pulse train signal 36, and, with this process, an excitation signal is generated. The excitation signal is supplied to the microwave resonator 12 through the circulator 44.

A static magnetic field is swept by the electromagnets 14, and, when the ESR phenomenon is caused as a result of the sweeping of the static magnetic field, an amount of light absorption by the sample 10 changes. The light from the sample 10 is detected by an optical detector 60. A detection signal indicating an amount of this change is supplied to a phase demodulator 62. A change of the amount of light absorption is synchronous with the modulation frequency Fm.

The phase demodulator 62 is, for example, a PSD, and executes the lock-in demodulation on the detection signal using the modulation signal 32 supplied from the second waveform generator 28. A signal which is output from the phase demodulator 62 passes through a low-pass filter 63, and, with this process, an ODMR signal 64 is obtained.

In the second and third preferred embodiments also, similar to the first preferred embodiment, even when the variable of the pulse sequence is changed, the modulation frequency Fm used in the lock-in demodulation does not need to be changed. In addition, it becomes possible to accurately repeat the pulse sequence according to the repetition frequency Fp. Moreover, it becomes possible to increase the pulse sequence density on the time axis.

The longitudinally detected ESR, the electrically detected magnetic resonance, and the optically detected magnetic resonance have been explained, but alternatively, the present embodiment may be applied to other ESRs.

In addition, in the first, second, and third preferred embodiments, the modulation is executed by switching the switch 34 ON and OFF, and, with this process, the pulse train signal 36 is generated. As another example configuration, the modulation is not limited to the modulation by the switching ON and OFF, and the modulation may be executed by another waveform (for example, a sine wave or the like). When the modulation is to be executed with the other waveforms, waveform data of the waveform used for the modulation are written in the second LUT 30, and a modulator is provided in place of the switch 34. The second waveform generator 28 refers to the second LUT 30 to generate the modulation signal 32, and the modulation signal 32 is supplied to the modulator which is provided in place of the switch. The modulator applies the modulation signal 32 on a signal generated by the first waveform generator 22, to generate the pulse train signal 36.

Alternatively, in place of using the switch 34 or the modulator, the first waveform generator 22 may directly generate the pulse train signal 36 and send the pulse train signal 36 to the mixer 40. In this case, a controller (not shown) writes waveform pulse pattern data of the modulated pulse train signal 36 in the first LUT 24, and the switch 34 and the modulator are not used. In this case, the modulation signal 32 generated by the second waveform generator 28 is not supplied to the mixer 40 and is supplied only to the phase demodulator 48 and is used as a reference wave for the phase demodulation (lock-in demodulation). Needless to say, the modulated pulse train signal 36 and the modulation signal 32 are synchronous signals.

What is claimed is:

1. An electron spin resonance apparatus comprising:
a microwave generator that generates a microwave signal;
a pulse train signal generator that generates a pulse train signal according to a modulation frequency Fm and a repetition frequency Fp of a pulse sequence;
an excitation signal generator that applies the pulse train signal on the microwave signal to generate an excitation signal;
an electron spin resonance chamber that houses a sample and to which the excitation signal is sent; and
a demodulator that executes a lock-in demodulation using the modulation frequency Fm on a detected signal reflecting electron spin resonance caused in the sample, to generate an analysis target signal, wherein
the repetition frequency Fp and the modulation frequency Fm are in a relationship $Fp=2n \times Fm$, wherein n is an integer greater than or equal to 1.

2. An electron spin resonance apparatus comprising:
a microwave generator that generates a microwave signal;
a pulse train signal generator that generates a pulse train signal in which a reference pulse train is repeated with a repetition frequency Fp and which is modulated by a modulation signal having a modulation frequency Fm;
an excitation signal generator that modulates the microwave signal with the pulse train signal to generate an excitation signal;
an electron spin resonance chamber that houses a sample and to which the excitation signal is supplied;
a detector that generates a detected signal reflecting electron spin resonance caused in the sample; and
a demodulator that executes a lock-in demodulation on the detected signal based on the modulation signal, to generate an analysis target signal, wherein
the repetition frequency Fp and the modulation frequency Fm are in a relationship $Fp=2n \times Fm$, wherein n is an integer greater than or equal to 1, and
the repetition of the reference pulse train and the modulation by the modulation signal are synchronous with each other.

3. The electron spin resonance apparatus according to claim 2, wherein
the pulse train signal generator comprises:
a pulse pattern generator that repeatedly generates a pulse pattern forming the pulse sequence according to the repetition frequency Fp;
a modulation signal generator that generates a modulation signal which is repeatedly switched ON and OFF with the modulation frequency Fm; and
a generator that applies the modulation signal on an original pulse train in which the pulse patterns are combined, to generate the pulse train signal.

4. The electron spin resonance apparatus according to claim 3, wherein
the pulse pattern generator and the modulation signal generator operate synchronously with each other.

5. The electron spin resonance apparatus according to claim 3, wherein
the pulse pattern includes two pulses having a time interval τ, and
the electron spin resonance apparatus further comprises a function to change the time interval τ for each measurement.

6. The electron spin resonance apparatus according to claim 2, wherein
the repetition frequency Fp is variably set according to a measurement situation under a condition where the modulation frequency Fm is fixed.

7. The electron spin resonance apparatus according to claim 2, wherein
the detection signal is detected by one of detection of longitudinal magnetization, detection of an electric characteristic in the sample, and detection of an optical characteristic in the sample.

* * * * *